United States Patent
Saito et al.

(10) Patent No.: US 9,196,458 B2
(45) Date of Patent: Nov. 24, 2015

(54) CHARGED PARTICLE BEAM DRAWING APPARATUS AND DRAWING CHAMBER

(71) Applicant: NuFlare Technology, Inc, Yokohama (JP)

(72) Inventors: Hiroyasu Saito, Yokohama (JP); Yoshinori Nakagawa, Numazu (JP); Seiichi Nakazawa, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/326,997

(22) Filed: Jul. 9, 2014

(65) Prior Publication Data

US 2015/0021495 A1    Jan. 22, 2015

(30) Foreign Application Priority Data

Jul. 17, 2013  (JP) .................................. 2013-148593
Jun. 24, 2014  (JP) .................................. 2014-128883

(51) Int. Cl.
*H01J 37/20* (2006.01)
*H01J 37/317* (2006.01)
*H01J 37/16* (2006.01)

(52) U.S. Cl.
CPC ............. *H01J 37/3174* (2013.01); *H01J 37/16* (2013.01); *H01J 2237/20* (2013.01)

(58) Field of Classification Search
USPC ............... 250/453.11, 454.11, 455.11, 492.1, 250/492.2, 492.3
See application file for complete search history.

(56) References Cited

FOREIGN PATENT DOCUMENTS

| JP | 2002-260566 | 9/2002 |
|---|---|---|
| JP | 2005-019708 | 1/2005 |

OTHER PUBLICATIONS

Office Action issued Sep. 11, 2015, in Korean Patent Application No. 10-2014-0079677 (with English translation).

*Primary Examiner* — Nicole Ippolito
*Assistant Examiner* — Hanway Chang
(74) *Attorney, Agent, or Firm* — Oblon, McClelland, Maier & Neustadt, L.L.P.

(57) ABSTRACT

A charged particle beam drawing apparatus includes: a stage configured to support a specimen as a drawing target; and an airtight drawing chamber formed into a box shape provided with a side wall and a bottom plate, and configured to house the stage. The bottom plate includes: multiple support portions connected to the side wall and configured to support the stage; and a curved portion connected to the support portions and having a convex shape curved outward.

20 Claims, 6 Drawing Sheets

CHARGED PARTICLE BEAM DRAWING APPARATUS AND DRAWING CHAMBER

CROSS-REFERENCE TO THE RELATED APPLICATION

This application is based on and claims the benefit of priority from Japanese Patent Applications No. 2013-148593, filed on Jul. 17, 2013 and No. 2014-128883, filed on Jun. 24, 2014; the entire contents of which are incorporated herein by reference.

FIELD

Embodiments described herein relate generally to a charged particle beam drawing apparatus and a drawing chamber.

BACKGROUND

Along with recent advancement toward higher integration and lager capacity of large scale integrated circuits (LSIs), the circuit line width to be required for semiconductor devices has become smaller and smaller. The photolithography technique is used to form desired circuit patterns in semiconductor devices. In this photolithography technique, pattern transfer is performed using a defined pattern called a photomask or a reticle. A charged particle beam drawing apparatus having fine resolution is used to produce highly accurate masks to be used for such pattern transfer.

As an example of the charged particle beam drawing apparatus of this type, there has been developed a charged particle beam drawing apparatus configured to draw a pattern on a specimen, such as a mask or a blank, on a stage by deflecting and focusing a charged particle beam onto a predetermined position on the specimen on the stage while moving the stage on which the specimen is placed. In the charged particle beam drawing apparatus, an optical lens barrel is placed above a drawing chamber that constitutes a specimen space. The optical lens barrel incorporates a charged particle optical system for projecting the charged particle beam.

In the charged particle beam drawing apparatus described above, the drawing chamber functioning as a vacuum container slightly changes its shape due to an influence of the atmospheric pressure when the drawing chamber is set to a vacuum state by decompression. In this case, drawing accuracy may deteriorate if the stage inside the drawing chamber is tilted by a deformation of a bottom surface, i.e., a bottom plate of the drawing chamber and the projection position of the charged particle beam deviates from the predetermined position. For this reason, the drawing chamber is formed to have sufficient rigidity so as not to cause a significant deformation even when the inside of the drawing chamber is set to the vacuum state.

However, in order to impart the sufficient rigidity to the drawing chamber, a thickness (a plate thickness) of the bottom plate has to be increased, for example, which makes the drawing chamber very heavy. Particularly, the drawing accuracy recently required is accuracy with an allowable range of several micrometers, and a deformation of the drawing chamber by about tens to hundreds of micrometers even causes a problem. In this regard, the bottom plate needs to be made thicker and the weight of the drawing chamber tends to be increased accordingly.

DETAILED DESCRIPTION

According to one embodiment of the present invention, a charged particle beam drawing apparatus includes: a stage configured to support a specimen as a drawing target; and an airtight drawing chamber formed into a box shape provided with a side wall and a bottom plate, and configured to house the stage, wherein the bottom plate includes a plurality of support portions connected to the side wall and configured to support the stage, and a curved portion connected to the plurality of the support portions and having a convex shape curved outward.

According to another embodiment, a drawing chamber includes: an airtight housing configured to house a stage to support a specimen as a drawing target, wherein the housing is formed into a box shape provided with a side wall and a bottom plate, and the bottom plate includes a plurality of support portions connected to the side wall and configured to support the stage, and a curved portion connected to the plurality of the support portions and having a convex shape curved outward.

Various Embodiments will be described hereinafter with reference to the accompanying drawings.

(First Embodiment)

A first embodiment will be described with reference to FIG. 1 to FIG. 6.

Figure 1:
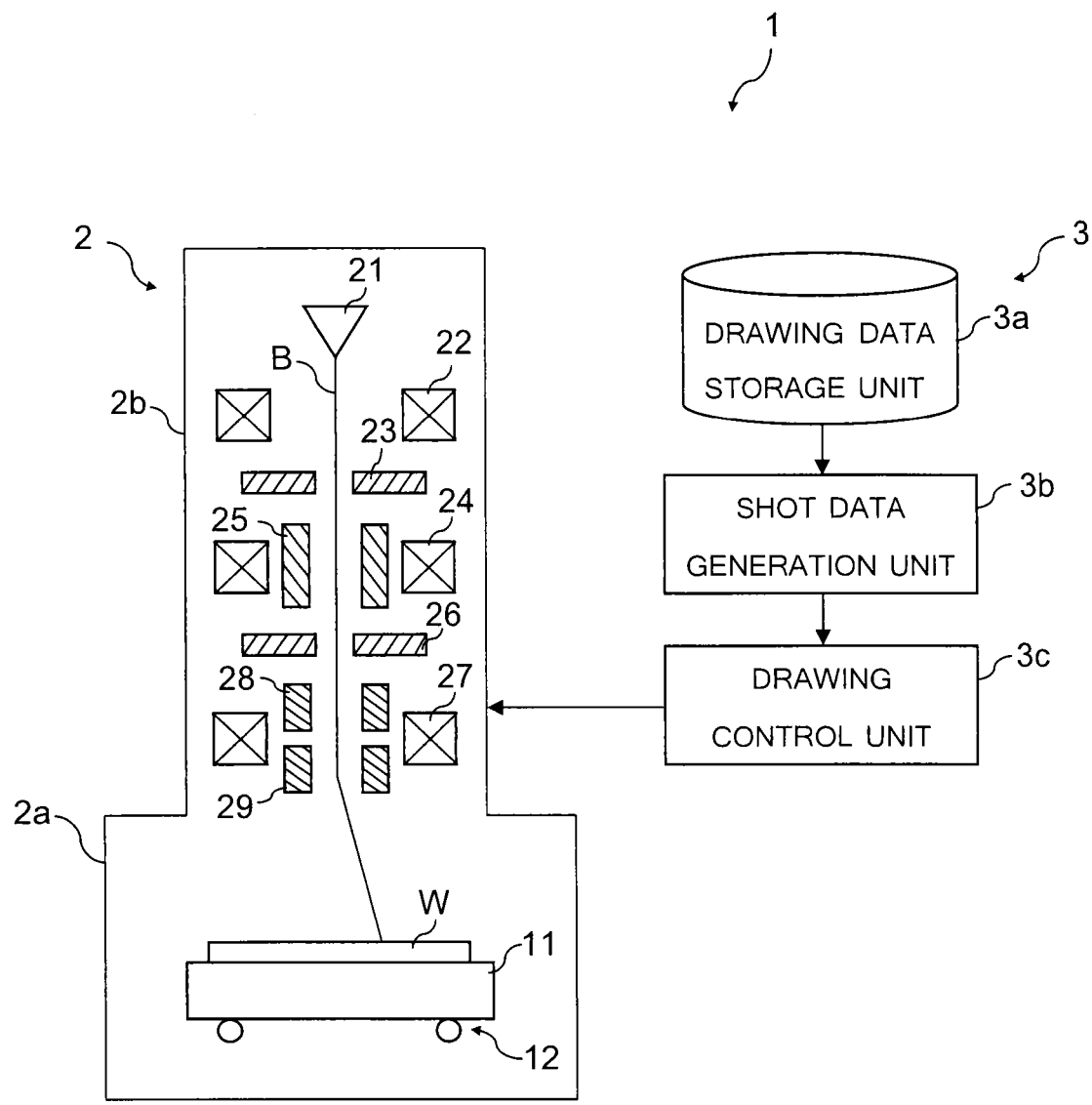
FIG. 1 is a diagram showing a schematic configuration of a charged particle beam drawing apparatus according to a first embodiment.
Figure 2:
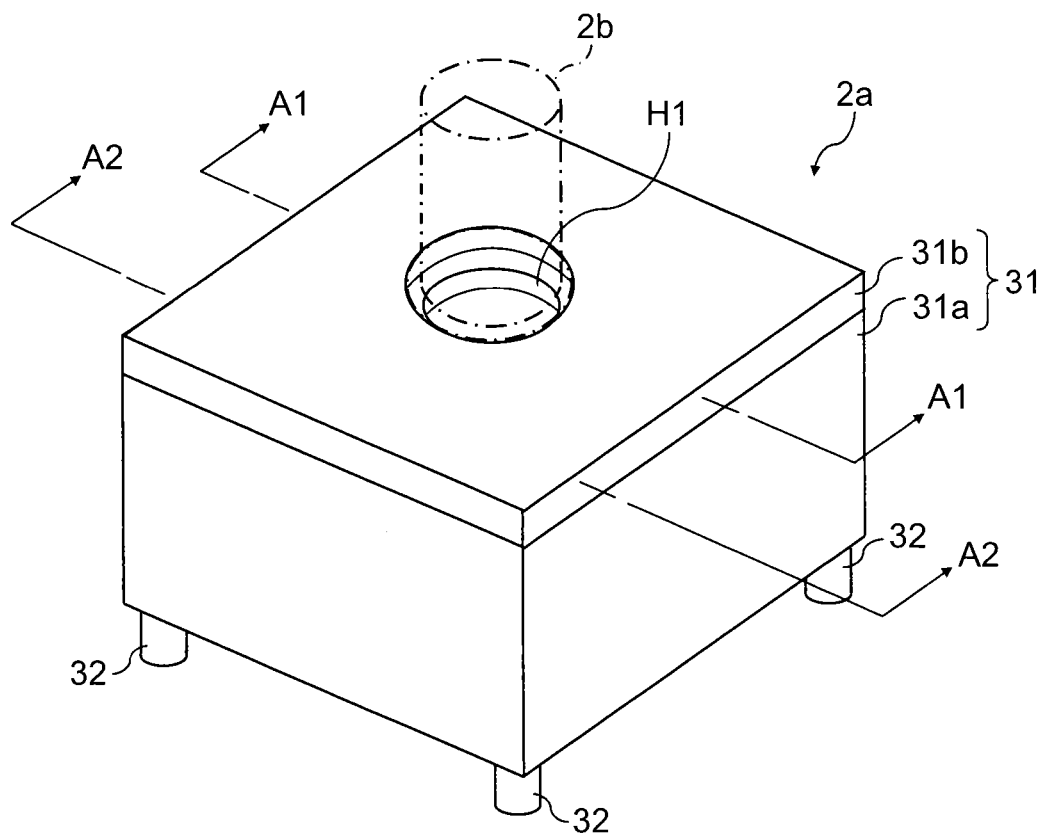
FIG. 2 is a perspective view showing a drawing chamber according to the first embodiment.

As shown in FIG. 1, a charged particle beam drawing apparatus 1 according to the first embodiment includes a drawing unit 2 configured to conduct drawing by use of a charged particle beam, and a control unit 3 configured to control the drawing unit 2. The charged particle beam drawing apparatus 1 is an example of a variable shaped-type drawing apparatus which uses an electron beam, for instance, as a charged particle beam. However, the charged particle beam is not limited only to the electron beam and other charged particle beams such as an ion beam are also applicable.

The drawing unit 2 includes a drawing chamber 2a constituting a specimen space (a drawing space) to house a specimen W as a drawing target, and an optical lens barrel 2b connected to the drawing chamber 2a. The drawing chamber 2a has airtightness (hermetic sealing) and functions as a decompression chamber (a vacuum chamber). Meanwhile, the optical lens barrel 2b is provided on an upper face of the drawing chamber 2a, and is configured to shape and deflect the electron beam by using a charged particle optical system (an electron optical system) and to project the electron beam onto the specimen W in the drawing chamber 2a. In the beam projection, the inside of both of the drawing chamber 2a and the optical lens barrel 2b is decompressed and set to a vacuum state.

Provided inside the drawing chamber 2a are a stage 11 configured to support the specimen W such as a mask or a blank, and a stage movement mechanism 12 configured to move the stage 11. The stage movement mechanism 12 is a mechanism configured to move the stage 11 in an X-axis direction and a Y-axis direction (hereinafter simply referred to as the X direction and the Y direction), which are orthogonal to each other on a horizontal plane.

Provided inside the optical lens barrel 2b are: a beam emission unit 21 such as an electron gun configured to emit an electron beam B; an illumination lens 22 configured to collect the electron beam B; a first aperture 23 for shaping the beam; a projection lens 24 for performing projection; a shaping deflector 25 for shaping the beam; a second aperture 26 for shaping the beam; an objective lens 27 configured to focus the beam on the specimen W; and a sub-deflector 28 and a main deflector 29 configured to control a beam shot position on the specimen W. These constituents 21 to 29 function together as the charged particle optical system.

In the drawing unit 2, the electron beam B is emitted from the beam emission unit 21 and is projected onto the first aperture 23 via the illumination lens 22. The first aperture 23 has a rectangular opening, for example. Accordingly, when the electron beam B passes through the first aperture 23, a cross-sectional shape of the electron beam is shaped into a rectangle and is projected onto the second aperture 26 via the projection lens 24. Note that the projection position can be changed with deflection by the shaping deflector 25, and the shape and dimensions of the electron beam B can be controlled by changing the projection position. Thereafter, the electron beam B having passed through the second aperture 26 is focused and projected onto the specimen W on the stage 11 via the objective lens 27. In this projection, a shot position of the electron beam B on the specimen W on the stage 11 can be changed with the deflection by the sub-deflector 28 and the main deflector 29.

The control unit 3 includes: a drawing data storage unit 3a configured to store drawing data; a shot data generation unit 3b configured to generate shot data by processing the drawing data; and a drawing control unit 3c configured to control the drawing unit 2. Note that the shot data generation unit 3b and the drawing control unit 3c may be formed from hardware such as electric circuits, software such as programs designed to execute the respective functions, or a combination of the hardware and the software.

The drawing data storage unit 3a is a storage unit configured to store the drawing data used for drawing a pattern on the specimen W. The drawing data is data converted into a format adapted to the charged particle beam drawing apparatus 1 so as to allow design data (layout data) created by a semiconductor integrated circuit designer or the like to be inputted to the charged particle beam drawing apparatus 1. The drawing data is inputted from an external device and saved in the drawing data storage unit 3a. For example, a magnetic disk device, a semiconductor disk device (a flash memory), and the like can be used as the drawing data storage unit 3a.

Here, the above-mentioned design data usually includes numerous small patterns (graphics and the like) and its data quantity reaches quite a large amount. If the design data is directly converted into another format, the data quantity after the conversion is increased further. For this reason, the drawing data is subjected to decompression of its data quantity by means of data hierarchization, pattern array display, and the like. For example, the drawing data is hierarchized into a chip level, a frame level subordinate to the chip level, a block level subordinate to the frame level, a cell level subordinate to the block level, a graphic level subordinate to the cell level, and so forth (a hierarchical structure).

The shot data generation unit 3b divides a drawing pattern defined by the drawing data into multiple strip-shaped stripes (of which a longitudinal direction is the X direction and a short-side direction is the Y direction), and further divides the stripes into many sub-fields in a matrix. In addition, the shot data generation unit 3b generates shot data by determining the shape, size, position, and the like of a graphic in each sub-field, and if a graphic cannot be drawn by one shot, by dividing the graphic into multiple partial regions each of which can be drawn by one shot. Here, the length in the short-side direction (the Y direction) of each stripe is set to a length within which the electron beam B can be deflected by main deflection.

When drawing the above-described drawing pattern, the drawing control unit 3c draws each graphic by moving the stage 11 in the longitudinal direction (the X direction) of the stripe, locating the electron beam B at each sub-field using the main deflector 29, and shooting the electron beam B at a predetermined position in the sub-field using the sub-deflector 28. Thereafter, when the drawing on one stripe is completed, the stage 11 is moved stepwise in the Y direction and then the drawing on the next stripe is conducted. The drawing with the electron beam B is conducted in the entire drawing region on the specimen W by repeating the series of these procedures (an example of a drawing operation). Here, since the stage 11 continuously moves in one direction during the drawing, the main deflector 29 moves the drawing origin point from one sub-field after another so that the drawing origin point can follow the movement of the stage 11.

As described above, the sub-deflector 28 and the main deflector 29 deflect the electron beam B to determine its projection position while causing the electron beam B to follow the stage 11 that moves continuously. Thus, drawing time can be reduced by continuously moving the stage 11 in the X direction and moving the shot position of the electron beam B along with the movement of the stage 11. Although the stage 11 is continuously moved in the X direction in the embodiment, the invention is not limited only to this. For example, a drawing method called a step-and-repeat method may be used which performs the drawing in one sub-field while stopping the stage 11 and suspends drawing when moving the stage 11 to the next sub-field.

Next, the aforementioned drawing chamber 2a will be described in detail with reference to FIG. 2 to FIG. 5.

As shown in FIG. 2 to FIG. 5, the drawing chamber 2a includes a housing 31 serving as a body, and multiple leg portions 32 which support the housing 31. The housing 31 is formed from a box body 31a in a box shape with an upper opening, and a lid body 31b which closes the opening of the box body 31a.

The lid body 31b includes a circular opening H1 into which the optical lens barrel 2b (see chain dashed lines in FIG. 2) is fitted. The opening H1 is formed substantially in the center of the lid body 31b. The optical lens barrel 2b is fixed to the opening H1 while interposing a sealing member (not shown) such as an O-ring in between. An interior part of the optical lens barrel 2b is connected to the inside of the drawing chamber 2a.

Figure 3:
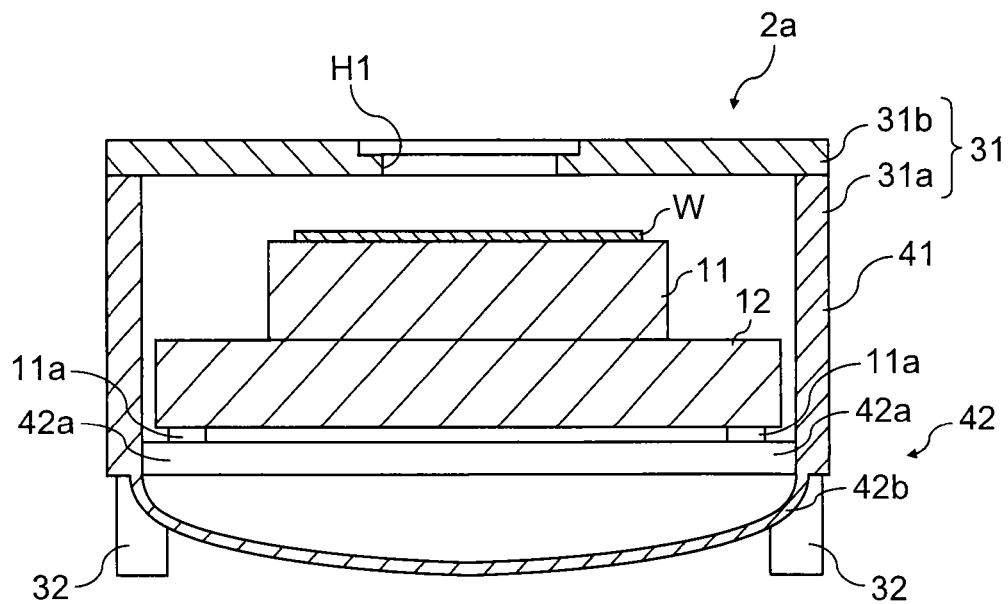
FIG. 3 is a cross-sectional view of the drawing chamber taken along the A1-A1 line in FIG. 2.
Figure 4:
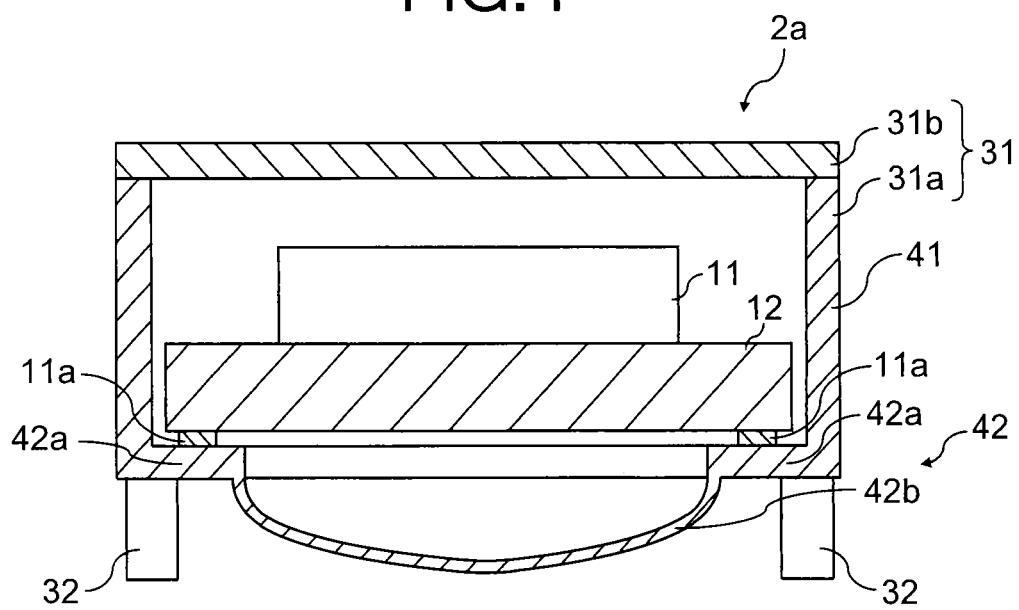
FIG. 4 is a cross-sectional view of the drawing chamber taken along the A2-A2 line in FIG. 2.
Figure 5:
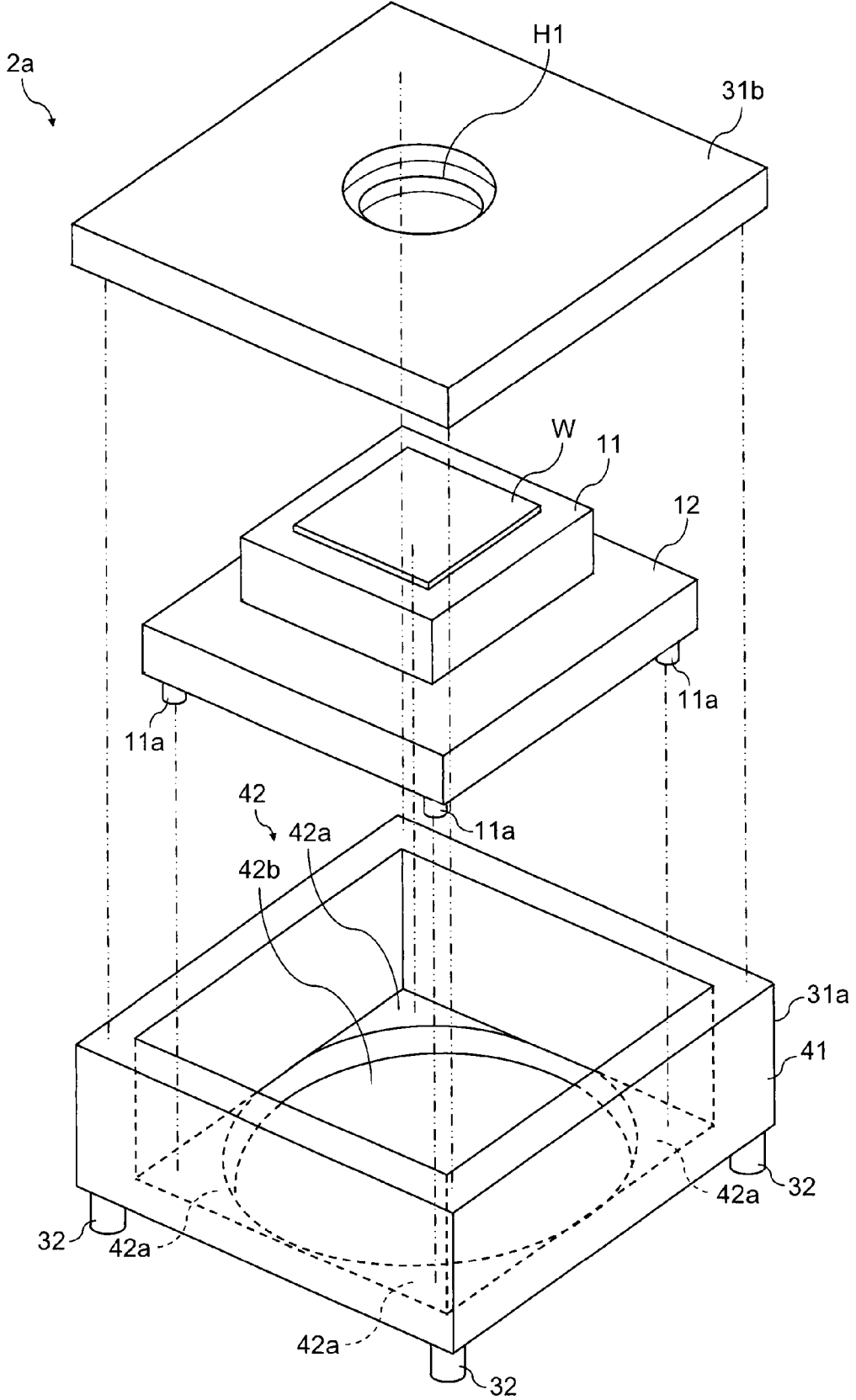
FIG. 5 is an exploded perspective view showing the drawing chamber of FIG. 2.

The box body 31a is formed from a side wall (an outer peripheral wall) 41 constituting a wall on the outer periphery, and a bottom plate 42 configured to support the stage 11 and the stage movement mechanism 12 in an internal space defined by the side wall 41 (see FIG. 3 to FIG. 5). The lid body 31b is fixed onto the box body 31a, and the box body 31a constitutes the housing 31 in conjunction with the lid body 31b.

The bottom plate 42 includes multiple support portions 42a configured to support the stage 11 and the stage movement mechanism 12, and a curved portion 42b in a convex shape curved outward (see FIG. 3 to FIG. 5). Here, the support portions 42a and the curved portion 42b are formed integrally with the side wall 41 of the box body 31a.

The support portions 42a are connected to the side wall 41 of the box body 31a and respectively located in four corners of the box body 31a, i.e., four corners of the bottom plate 42, thereby forming part of the bottom plate 42. Four leg portions 11a of the stage movement mechanism 12 are provided to respective installation surfaces (stage attachment surfaces) which are upper surfaces of the support portions 42a. The stage movement mechanism 12 is installed on the support portions 42a, and together with the stage 11, is supported by the support portions 42a. Although the support portions 42a have the same thickness and are set uniform, the invention is not limited only to this.

The curved portion 42b is connected to the support portions 42a and the side wall 41, and is located in the center of the bottom plate 42. Thus, the support portions 42a and the curved portion 42b collectively constitute the bottom plate 42. The curved portion 42b is formed into a shape of a cup (a hollow hemispherical shape) which is curved outward from the housing 31, i.e., in a direction opposite from the stage 11 located inside the housing 31. The curved potion 42b has such a curved surface that is continuous with the respective installation surfaces of the support portions 42a. An outer surface constituting an opposite surface from the curved surface is formed into a curved surface that is curved similarly, whereby the curved portion 42b has a uniform thickness. However, the invention is not limited only to this.

Note that the thickness of the curved portion 42b is smaller than the thickness of the support members 42a, and the diameter of the opening of the curved portion 42b in planar view is set equal to a distance of separation between the opposed side wall surfaces of the box body 31a. Moreover, the degree of curve (curvature) of the curved portion 42b is determined on the basis of the thickness of the curved portion 42b and the thickness of the side wall 41 of the housing 31 so as not to cause deformations of the support portions 42a.

As for dimensions of the housing 31, if its height is at a (such as 600 mm), for example, then its longitudinal and lateral lengths are about 2a (such as 1200 mm), respectively. In the meantime, if the thickness of each support portion 42a is at b (such as 100 mm), the thickness of the curved portion 42b is in a range from b/5 to b/3 (such as from 20 mm to 100/3 mm). Here, the height of the curved portion 42b is at a value determined on the basis of the aforementioned degree of curve.

Figure 6:
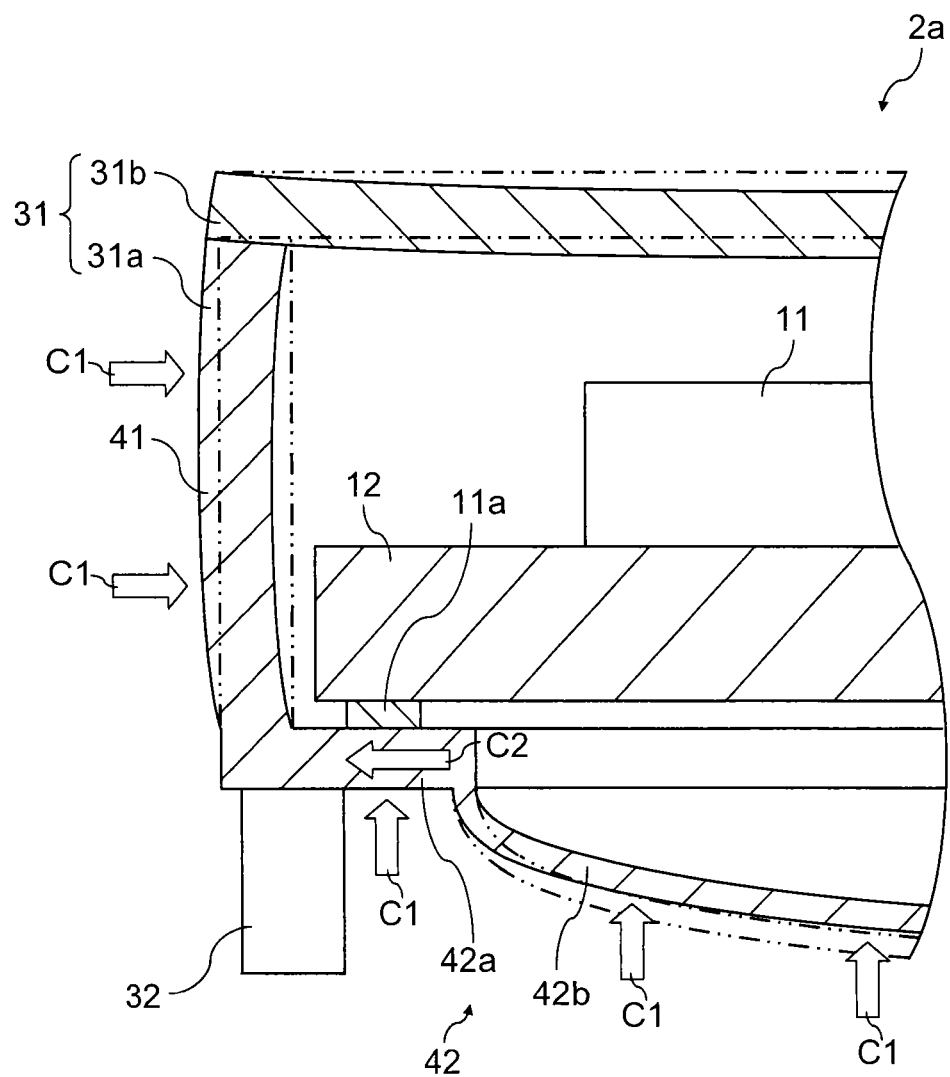
FIG. 6 is a partially enlarged cross-sectional view showing the drawing chamber of FIG. 4.

A decompressed state (a vacuum state) of the drawing chamber 2a having the aforementioned configuration will be described in detail with reference to FIG. 6. In FIG. 6, solid lines illustrate the drawing chamber 2a in the decompressed state and chain double dashed lines illustrate the drawing chamber 2a in a pre-decompressed state (in the original shape).

The pressure of the inside of the drawing chamber 2a and the optical lens barrel 2b is reduced to a predetermined degree of vacuum prior to start of the drawing. Thus, the inside of both of the drawing chamber 2a and the optical lens barrel 2b is set in the vacuum state. At this time, the drawing chamber 2a is deformed by the atmospheric pressure. For instance, the drawing chamber 2a may be deformed inward as shown in FIG. 6.

Here, the deformation of the side wall 41 is governed by rigidity of the side wall 41. The side wall 41 is apt to bend to the outside of the chamber (outward) due to a force that presses the lid body 31b and the bottom plate 42 to the inside of the chamber (inward). On the other hand, the side wall 41 is apt to bend to the inside of the chamber due to the atmospheric pressure applied to the side wall 41. As a consequence, the deformation of the side wall 41 represents a confrontation between the above-described two forces. For this reason, depending on the rigidity of the side wall 41, the side wall 41 may be deformed to the inside or outside of the chamber, or may bend in an undulating fashion (for example, portions of the side wall 41 in the vicinities of upper and lower surfaces may bend to the outside of the chamber while a central portion of the side wall 41 may bend to the inside of the chamber).

As a specific example, as shown in FIG. 6, the lid body 31b of the housing 31 of the drawing chamber 2a, and the side wall 41 of the box body 31a thereof may be deformed slightly (by about tens to hundreds of micrometers, for example) in such a way as to bend inward and outward, respectively. In addition, the curved portion 42b of the bottom plate 42 of the box body 31a may be deformed slightly (by about tens to hundreds of micrometers, for example) inward. Note that the drawing chamber 2a recovers the original shape when the inside of the drawing chamber 2a and the optical lens barrel 2b is released from the vacuum state.

As described above, the atmospheric pressure deforms the lid body 31b inward (to the inside of the chamber) and deforms the side wall 41 of the box body 31a outward (to the outside of the chamber). The atmospheric pressure also deforms the curved portion 42b of the bottom plate 42 inward. At this time, however, the support portions 42a are hardly deformed because a force applied to each support portion 42a due to the deformation of the curved portion 42b is cancelled (offset) by a force applied to each support portion 42a due to the deformation of the side wall 41. Hence, the support portions 42a are inhibited from deformations.

Here, the side wall 41 functions as a transmission unit which transmits the forces attributed to the atmospheric pressure, the deformation of the lid body 31b, and the like to the support portions 42a. The deformation of the side wall 41 in this case affects the deformations of the installation surfaces (the stage attachment surfaces) of the support portions 42a. However, the deformation of the side wall 41 acts on the support portions 42a in such a way as not to incline the installation surfaces.

For example, as shown in FIG. 6, the bottom plate 42 brings about a deformation in such a way as to be recessed to the inside of the chamber by receiving the atmospheric pressure C1 while the side wall 41 brings about a deformation in such a way as to bulge to the outside of the chamber by receiving forces from the upper and lower surfaces thereof and receiving the atmospheric pressure C1 (when the rigidity of the upper and lower surfaces is smaller than the rigidity of its side surface). In this case, the support portions 42a, i.e., the installation surfaces (the stage attachment surfaces) thereof are inclined if the bottom plate 42 does not include the curved portion 42b.

On the other hand, if the bottom plate 42 includes the curved portion 42b, a force C2 to spread the curved portion 42b out in the outer peripheral direction of the chamber acts on the support portions 42a when the curved portion 42b is deformed toward the inside of the chamber by the atmospheric pressure C1, whereby the force C2 acts to restore the inclinations of the installation surfaces (the stage attachment surfaces) of the support portions 42a to the original state. In other words, the curved surface structure of the curved portion 42b is formed so as to cancel the deformation attributed to the atmosphere and the vacuum.

Here, if the curved portion 42b has a large curvature, for example, the force C2 to spread the curved portion 42b out in the outer peripheral direction of the chamber is small, but an amount of displacement for sustaining the force C2 is large. On the other hand, if the curved portion 42b has a small curvature, the force C2 to spread the curved portion 42b out in the outer peripheral direction of the chamber is large, but the amount of displacement for sustaining the force C2 is small. For this reason, the deformations of the installation surfaces (the stage attachment surfaces) of the support portions 42a can be minimized by setting a proper (appropriate) curvature.

Application of the curved surface structure to the bottom plate 42 as described above suppresses the deformations of the support portions 42a that support the stage 11 and the stage movement mechanism 12, thereby inhibiting the installation surfaces being the upper surfaces thereof from tilting. Accordingly, it is possible to inhibit the stage 11 from tilting due to the deformation of the drawing chamber 2a, namely, the deformation of the bottom plate 42, attributed to the atmospheric pressure, and thereby to prevent deterioration in drawing accuracy. Thus, the drawing accuracy can be maintained without increasing the thickness (a plate thickness) of the bottom plate 42 in order to impart sufficient rigidity to the drawing chamber 2a. Accordingly, it is possible to reduce the weight of the drawing chamber 2a while maintaining the drawing accuracy.

Here, the atmospheric pressure varies depending on passages of a high-pressure area and a low-pressure area (changes in weather). Accordingly, the force to be applied to the support portions 42a varies depending on a deformation amount of the drawing chamber 2a, i.e., a deformation amount of the side wall 41, attributed to the atmospheric pressure variation. Similarly, a deformation amount of the curved portion 42b varies as well. Hence, the force to be applied to the support portions 42a attributed to the deformation of the curved portion 42b and the force to be applied to the support portions 42a attributed to the deformation of the side wall 41 (transmission of the force mentioned above) are favorably offset whereby the deformation of the support portions 42a are inhibited. For this reason, even when the atmospheric pressure varies, the support portions 42a supporting the stage 11 and the stage movement mechanism 12 are kept from the deformations. This makes it possible to inhibit the stage 11 from tilting attributed to the atmospheric pressure variation, and thereby to inhibit deterioration in the drawing accuracy attributed to the atmospheric pressure variation.

Now, a flat surface structure of the bottom plate 42 will be compared with the curved surface structure thereof. A certain plate thickness for obtaining the same rigidity as that of the curved surface structure (where the plate thickness in the flat surface structure is greater than the plate thickness in the curved surface structure) is adopted as the plate thickness of the bottom plate 42 of the flat plane structure. Then, the weight of the drawing chamber of the flat surface structure is compared with the weight of the drawing chamber of the curved surface structure. The weight in the case of the curved surface structure is about half as heavy as the weight in the case of the flat surface structure. Thus, it is confirmed that the weight of the drawing chamber can be reduced by applying the curved surface structure to the bottom plate 42.

In the meantime, the same plate thickness as that of each of the support portions 42a (excluding the curved portion 42b) in the curved surface structure is adopted as the plate thickness of the bottom plate 42 of the flat surface structure (where the plate thickness in the flat surface structure is equal to the plate thickness in the curved surface structure). Then, a displacement in a Z direction (a direction orthogonal to the installation surface), i.e., a perpendicular displacement of the installation surface of each support portion 42a of the flat surface structure is compared with that of each support portion 42a of the curved surface structure. The perpendicular displacement in the curved surface structure, as expressed by "a maximum value—a minimum value," for instance, is about a quarter as large (about 1 μm, for example) as the perpendicular displacement in the flat surface structure. Thus, it is confirmed that the perpendicular displacement can be suppressed by applying the curved surface structure to the bottom plate 42.

As described above, according to the first embodiment, the bottom plate 42 is provided with: the multiple support portions 42a connected to the side wall 41 of the housing 31 and configured to support the stage 11 and the stage movement mechanism 12; and the curved portion 42b connected to the support portions 42a and having the convex shape curved outward. Thus, the force applied to each support portion 42a due to the deformation of the curved portion 42b is cancelled by the force applied to each support portion 42a due to the deformation of the side wall 41. Hence, the support portions 42a are inhibited from the deformations. This makes it possible to inhibit the support portions 42a from the deformations and to inhibit the installation surfaces being the upper surfaces of the support portions 42a from tilting. Thus, it is possible to inhibit the stage 11 from tilting due to the deformation of the drawing 2a attributed to the atmospheric pressure, and thereby to prevent deterioration in the drawing accuracy. Accordingly, the drawing accuracy can be maintained without increasing the thickness (the plate thickness) of the bottom plate 42 in order to impart sufficient rigidity to the drawing chamber 2a. As a consequence, it is possible to reduce the weight of the drawing chamber 2a while maintaining the drawing accuracy.

Moreover, by setting the thickness of the curved portion 42b smaller than the thickness of the support portions 42a, it is possible to further promote the reduction in weight of the drawing chamber 2a while maintaining the drawing accuracy. In addition, the support portions 42a and the curved portion 42b formed integrally with the side wall 41 can achieve cancellation between the above-described forces more favorably than when joined together as separate components, for instance. Accordingly, it is possible to reliably suppress the deformations of the support portions 42a and to maintain the drawing accuracy more reliably. Furthermore, it is possible to conduct design, simulation, and the like easily and thereby to accurately achieve the above-described cancellation of the forces.

(Second Embodiment)

A second embodiment will be described with reference to FIG. 7 and FIG. 8. In the second embodiment, differences from the first embodiment (in light of the stage movement mechanism, a stage position measurement unit, and the drawing chamber) will be described while omitting descriptions of the rest of the components. Note that the same components will be denoted by the same reference numerals.

Figure 7:
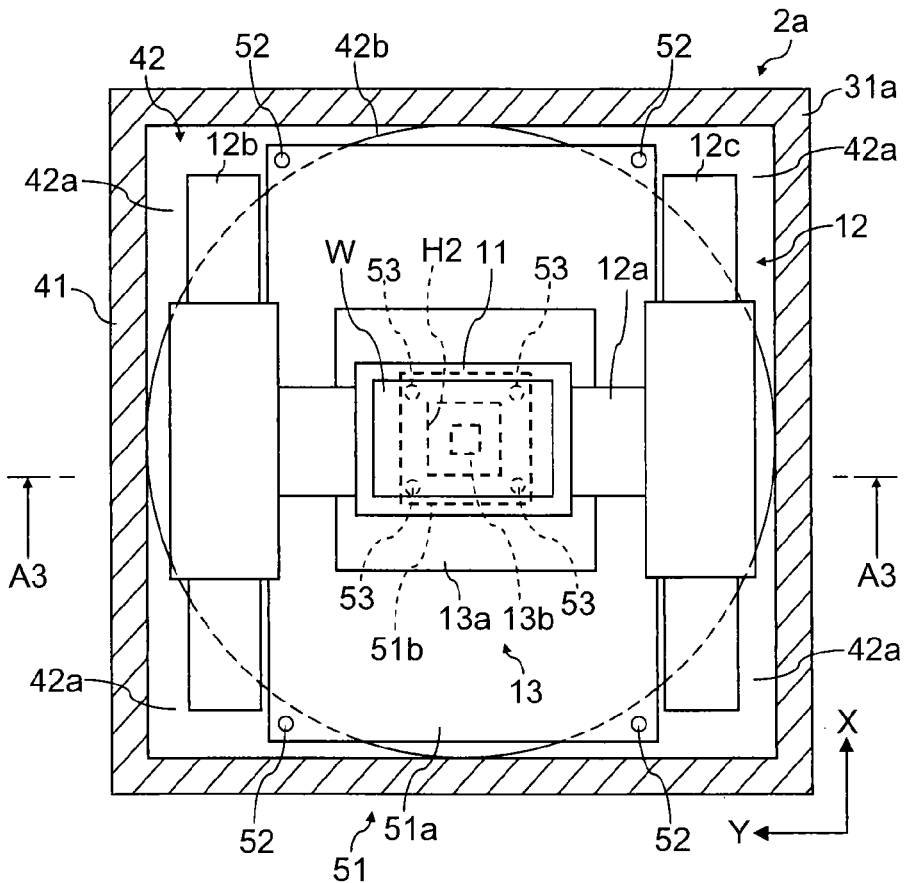
FIG. 7 is a transverse sectional view showing a schematic configuration of a drawing chamber included in a charged particle beam drawing apparatus according to a second embodiment.
Figure 8:
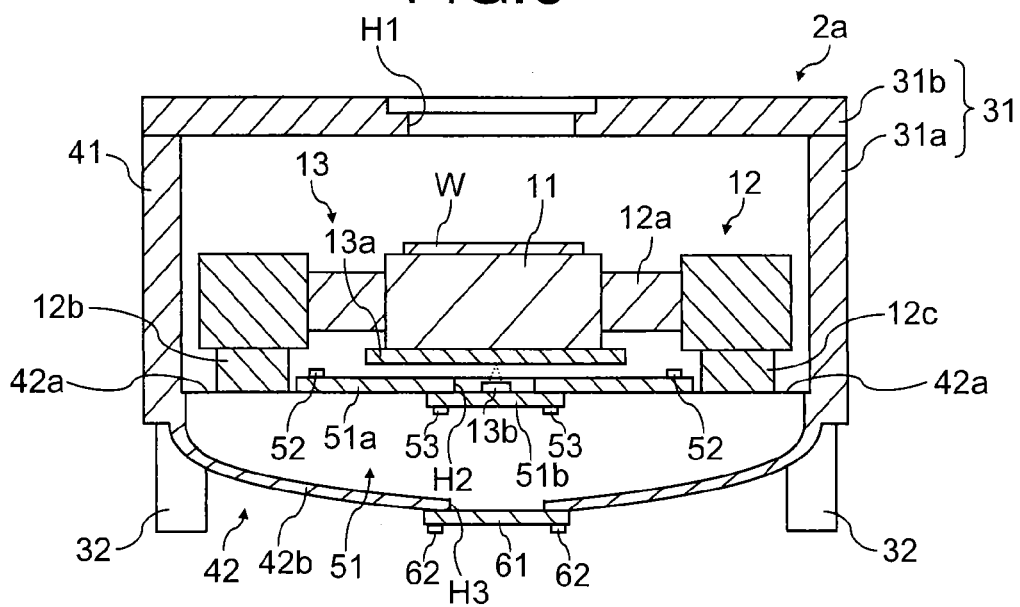
FIG. 8 is a cross-sectional view (a vertical sectional view) of the configuration of the drawing chamber taken along the A3-A3 line in FIG. 7.

As shown in FIG. 7 and FIG. 8, the stage 11, the stage movement mechanism 12 configured to move the stage 11, and a stage position measurement unit 13 configured to measure a position of the stage 11 are provided inside the drawing chamber 2a according to the second embodiment.

The stage movement mechanism 12 includes a Y-direction movement mechanism 12a configured to move the stage 11 in the Y direction (see FIG. 7), and a pair of X-direction movement mechanisms 12b and 12c configured to move the Y-direction movement mechanism 12a in the X direction (see FIG. 7).

The Y-direction movement mechanism 12a is a mechanism configured to support the stage 11 and to guide and move the stage 11 in the Y direction. Meanwhile, the pair of X-direction movement mechanisms 12b and 12c are mechanisms configured to support the Y-direction movement mechanism 12a and to guide and move the Y-direction movement mechanism 12a in the X direction together with the stage 11. A variety of movement mechanisms including a linear motor-type movement mechanism using a linear motor as a drive source, a feed screw-type movement mechanism using a servo motor as a drive source, for example, may be used as each of the movement mechanisms 12a to 12c.

The stage position measurement unit 13 includes a two-dimensional scale unit 13a provided on a lower surface of the stage 11, and an encoder head 13b functioning as a detection unit that detects scales on the two-dimensional scale unit 13a. The stage position measurement unit 13 detects the scales on the two-dimensional scale unit 13a provided on the lower surface of the stage 11 by using the encoder head 13b, thereby measuring the position of the stage 11.

The two-dimensional scale unit 13a includes lattice scales in the X direction and the Y direction (such as gratings). The scales are formed to be detectable by the encoder head 13b, and are arranged at regular intervals in the X direction and the Y direction. Various two-dimensional scale devices may be used as the two-dimensional scale unit 13a. Note that the two-dimensional scale unit 13a is a scale unit which includes scales in at least two directions (such as the X direction and the Y direction).

The encoder head 13b is a reflective laser sensor configured to project a laser beam onto the two-dimensional scale unit 13a and to receive the laser beam reflected by the two-dimensional scale unit 13a. The encoder head 13b performs length measurements by counting the scales on the two-dimensional scale unit 13a. Besides the reflective laser sensor, various encoder heads that are compatible with the two-dimensional scale unit 13a so as to detect the scales thereon may be used as the encoder head 13b. Here, the number of the encoder heads 13b is not particularly limited. For example, it is desirable to provide two, three, or more encoder heads 13b. If three or more encoder heads 13b are provided, then it is possible to detect a rotational (yawing) direction in addition to the X direction and the Y direction.

The encoder head 13b is located below the stage 11 so that the encoder head 13b can detect the scales on the two-dimensional scale unit 13a that is located on the lower surface of the stage 11. The encoder head 13b is supported by a support body 51. The support body 51 is formed from a support plate 51a provided with a through-hole H2, and a support plate 51b configured to locate and support the encoder head 13b inside the through-hole H2.

The support plate 51a is formed into a rectangular shape, for example. The support plate 51a is provided on the upper surfaces of the support portions 42a of the bottom plate 42 in such a way as to extend across and cover the curved portion 42b of the bottom plate 42, and is fixed by use of multiple fixation members 52 such as bolts. The support plate 51a is made attachable and detachable by means of attaching and detaching the fixation members 52.

The support plate 51b supports the encoder head 13b. Here, the support plate 51b is provided on a lower surface of the support plate 51a in such a way that the encoder head 13b can be located inside the through-hole H2 in the support plate 51a. The support plate 51b is fixed by use of multiple fixation members 53 such as bolts. The support plate 51b is made attachable and detachable by means of attaching and detaching the fixation members 53.

Meanwhile, an opening H3 being a through-hole is formed in the curved portion 42b located below the encoder head 13b. The opening 1-13 is closed by a lid body 61. The center of the opening H3 is positioned at the center of the curved portion 42b. The opening H3 is formed into a symmetrical shape (such as a circular shape or a square shape) with respect to the center of the curved portion 42b (the symmetry center) in planar view.

The lid body 61 is formed into a plate shape and is provided on the lower surface of the drawing chamber 2a while interposing a sealing member (not shown) such as an O-ring in between. The lid body 61 is fixed by use of multiple fixation members 62 such as bolts. The lid body 61 is made attachable and detachable by means of attaching and detaching the fixation members 61. Thus, the lid body 61 is formed into such a structure that can open and close the opening H3.

Here, when the drawing chamber 2a is in the decompressed state (the vacuum state), the curved portion 42b of the bottom plate 42 is deformed toward the inside of the chamber, for example, by the atmospheric pressure as in the case of the first embodiment. At this time, a force to spread the curved portion 42b out in the outer peripheral direction of the chamber acts on the support portions 42a, whereby the force acts to recover installation surfaces of the support portions 42a from the inclinations (the inclinations attributed to the atmospheric pressure). In other words, the curved surface structure of the curved portion 42b enables cancellation between the deformations of the support portions 42a attributed to the force to spread the curved portion 42b out and the deformations of the support portions 42a attributed to the atmospheric pressure.

For this reason, application of the curved surface structure to the bottom plate 42 can suppress the deformations of the support portions 42a, thereby preventing the installation surfaces being the upper surfaces thereof from tilting. Accordingly, it is possible to inhibit the stage 11 from tilting due to the deformation of the drawing 2a, namely, the deformation of the bottom plate 42, attributed to the atmospheric pressure, and thereby to prevent deterioration in the drawing accuracy. Furthermore, in addition to the stage 11, the support body 51 on the support portions 42a is also kept from tilting. Thus, the position of the encoder head 13b does not deviate from the two-dimensional scale unit 13a. Accordingly, it is possible to prevent the encoder head 13b from causing a measurement error.

Here, the lid body 61 and the support plate 51b are detached by a maintenance operator at the time of maintenance such as replacement of the encoder head 13b, and the encoder head 13b on the support plate 51b undergoes the maintenance. For example, if the maintenance of the encoder head 13b is conducted from above the drawing chamber 2a, the stage 11 and the stage movement mechanism 12 lie in the way. Instead, by providing the lid body 61 on the lower surface of the drawing chamber 2a and further providing the encoder head 13b on the support plate 51b located above the lid body 61, it is possible to detach the encoder head 13b together with the lid body 61 and the support plate 51b, and to conduct the maintenance of encoder head 13b easily. Thus, it is possible to improve maintainability of the encoder head 13b.

As described above, the second embodiment can achieve similar effects to those of the above-described first embodiment, which involve the weight reduction while maintaining the drawing accuracy. Moreover, it is possible to inhibit the position of the encoder head 13b from the deviation relative to the two-dimensional scale unit 13a, and to suppress a measurement error by the encoder head 13b. Thus, deterioration in accuracy in measuring the stage position can be suppressed. In addition, it is possible to detach the lid body 61 and then the encoder head 13b together with the support plate 51b, and to conduct the maintenance of the encoder head 13b easily. Thus, the maintainability of the encoder head 13b can be improved.

(Other Embodiments)

In the above-described first or second embodiment, the bottom plate 42 is formed by use of the multiple support portions 42a and the curved portion 42b. However, the invention is not limited only to this. The bottom plate 42 may be formed by setting the diameter of the curved portion 42b smaller than the longitudinal and lateral lengths of the bottom plate 42, and by using the a single support body, which has the multiple support portions 42a, together with the curved portion 42b. In the meantime, although the support portions 42a support the stage 11 with the assistance of the stage movement mechanism 12, the invention is not limited only to this. The stage 11 may be supported by a mechanism, a member, and the like other than the stage movement mechanism 12. Alternatively, the stage 11 may be directly supported while removing the stage movement mechanism 12.

Meanwhile, in the above-described second embodiment, the support plate 51a and the support plate 51b are used as the support body 51, and the support plate 51a is provided in such a way that the support plate 51a extends across and covers the curved portion 42b. However, the invention is not limited only to this. For example, the support plates may be arranged in combination like beams so as to extend across the curved portion 42b. Although the support plates 51a and 51b each in a plate shape are used as the support body 51, the invention is not limited only to this and support members in shapes other than the plate shape are also applicable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A charged particle beam drawing apparatus comprising:
   a stage configured to support a specimen as a drawing target; and
   an airtight drawing chamber formed into a box shape provided with a side wall and a bottom plate, and configured to house the stage, wherein
   the bottom plate includes
      a plurality of support portions connected to the side wall and configured to support the stage, and
      a curved portion connected to the plurality of the support portions and having a convex shape curved outward.

2. The charged particle beam drawing apparatus according to claim 1, wherein on the basis of a thickness of the side wall and a thickness of the curved portion, a degree of curve of the curved portion is determined so as to avoid deformations of the plurality of support portions.

3. The charged particle beam drawing apparatus according to claim 2, wherein a thickness of the curved portion is smaller than a thickness of each of the plurality of support portions.

4. The charged particle beam drawing apparatus according to claim 3, wherein the plurality of support portions and the curved portion are formed integrally with the side wall.

5. The charged particle beam drawing apparatus according to claim 2, wherein the plurality of support portions and the curved portion are formed integrally with the side wall.

6. The charged particle beam drawing apparatus according to claim 1, wherein a thickness of the curved portion is smaller than a thickness of each of the plurality of support portions.

7. The charged particle beam drawing apparatus according to claim 6, wherein the plurality of support portions and the curved portion are formed integrally with the side wall.

8. The charged particle beam drawing apparatus according to claim 1, wherein the plurality of support portions and the curved portion are formed integrally with the side wall.

9. The charged particle beam drawing apparatus according to claim 1, wherein
   the curved portion includes a through-hole in a symmetrical shape with respect to the center of the curved portion in planar view, and
   the charged particle beam drawing apparatus further comprises a lid body configured to close the through-hole.

10. The charged particle beam drawing apparatus according to claim 1, wherein
    the plurality of the support portions have an equal thickness, and
    a thickness of the curved portion is in a range from 1/5 to 1/3 of the thickness of the support portions.

11. A drawing chamber comprising an airtight housing configured to house a stage to support a specimen as a drawing target, wherein
    the housing is formed into a box shape provided with a side wall and a bottom plate, and
    the bottom plate includes
       a plurality of support portions connected to the side wall and configured to support the stage, and
       a curved portion connected to the plurality of the support portions and having a convex shape curved outward.

12. The drawing chamber according to claim 11, wherein on the basis of a thickness of the side wall and a thickness of the curved portion, a degree of curve of the curved portion is determined so as to avoid deformations of the plurality of support portions.

13. The drawing chamber according to claim 12, wherein a thickness of the curved portion is smaller than a thickness of each of the plurality of support portions.

14. The drawing chamber according to claim 13, wherein the plurality of support portions and the curved portion are formed integrally with the side wall.

15. The drawing chamber according to claim 12, wherein the plurality of support portions and the curved portion are formed integrally with the side wall.

16. The drawing chamber according to claim 11, wherein a thickness of the curved portion is smaller than a thickness of each of the plurality of support portions.

17. The drawing chamber according to claim 16, wherein the plurality of support portions and the curved portion are formed integrally with the side wall.

18. The drawing chamber according to claim 11, wherein the plurality of support portions and the curved portion are formed integrally with the side wall.

19. The drawing chamber according to claim 11, wherein
the curved portion includes a through-hole in a symmetrical shape with respect to the center of the curved portion in planar view, and
the charged particle beam drawing apparatus further comprises a lid body configured to close the through-hole.

20. The drawing chamber according to claim 11, wherein
the plurality of the support portions have an equal thickness, and
a thickness of the curved portion is in a range from $1/5$ to $1/3$ of the thickness of the support portions.

* * * * *